(12) United States Patent
Weiblen et al.

(10) Patent No.: US 6,528,868 B1
(45) Date of Patent: Mar. 4, 2003

(54) LEAD FRAME DEVICE AND METHOD FOR PRODUCING THE SAME

(75) Inventors: Kurt Weiblen, Metzingen (DE); Stefan Pinter, Reutlingen (DE); Frieder Haag, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/622,768
(22) PCT Filed: Dec. 21, 1998
(86) PCT No.: PCT/DE98/03742
§ 371 (c)(1),
(2), (4) Date: Oct. 12, 2000
(87) PCT Pub. No.: WO99/44234
PCT Pub. Date: Sep. 2, 1999

(30) Foreign Application Priority Data

Feb. 21, 1998 (DE) .......................................... 198 08 193

(51) Int. Cl.[7] .......................... H01L 23/495; H05K 7/20
(52) U.S. Cl. ...................... 257/669; 257/676; 257/677; 257/690; 361/723; 361/813
(58) Field of Search ................................ 257/666, 669, 257/672, 676, 677, 670, 674, 678, 690, 693, 695, 696, 784, 787; 438/110, 111, 112, 123; 361/723, 772, 773, 813

(56) References Cited

U.S. PATENT DOCUMENTS 3,778,887 A * 12/1973 Suzuki et al. ................. 29/588
3,808,673 A * 5/1974 Bottini ......................... 29/577
5,049,976 A   9/1991 Demmin et al. ............. 257/782
5,049,977 A * 9/1991 Sako ........................... 257/676
5,084,753 A * 1/1992 Gioda et al. ................. 257/685
5,394,751 A * 3/1995 Ishibashi ....................... 73/756
5,438,021 A   8/1995 Tagawa et al. ............. 438/107
5,440,170 A * 8/1995 Tsuji et al. ................. 257/676
5,598,034 A * 1/1997 Wakefield ................... 257/706
6,072,228 A * 6/2000 Hinkle et al. ............... 257/666

FOREIGN PATENT DOCUMENTS

| DE | 40 17 697 | 12/1991 |
| JP | 56 062 345 | 5/1981 |
| JP | 59-72757 | * 4/1984 |
| JP | 59 061 154 | 4/1984 |
| JP | 62 213 270 | 9/1987 |
| JP | 02 235 365 | 9/1990 |

* cited by examiner

Primary Examiner—David L. Talbott
Assistant Examiner—Alonzo Chambliss
(74) Attorney, Agent, or Firm—Kenyon & Kenyon

(57) ABSTRACT

A lead frame device having a lead frame made of copper, copper alloy or copper compound having a die pad area, within which a chip is to be mounted, and having a multiplicity of leads, which are arranged around the die pad area; and having a die pad made of silicon which is mounted in the die pad area on the lead frame to accommodate the chip.

6 Claims, 3 Drawing Sheets

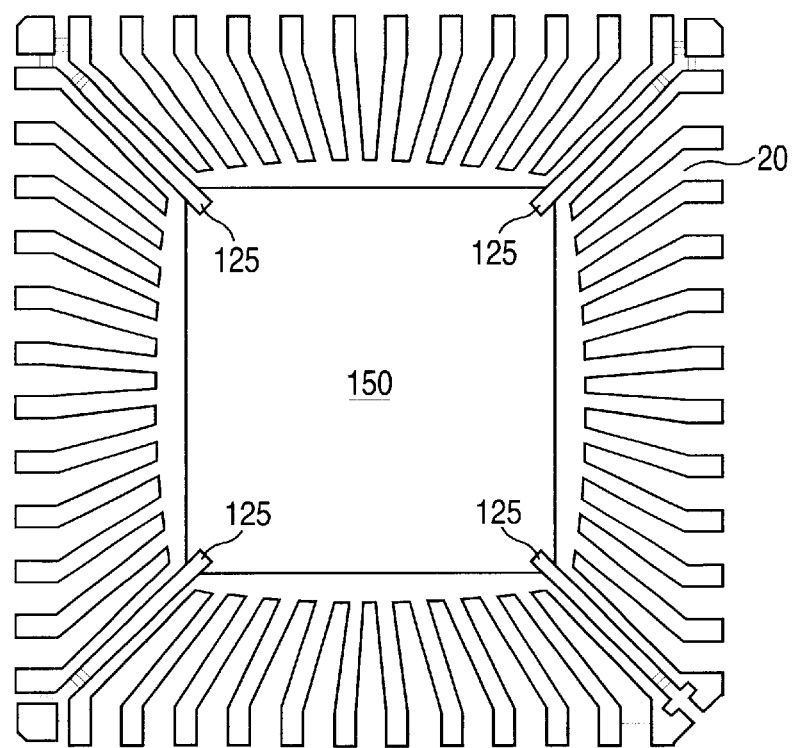
FIG. 2
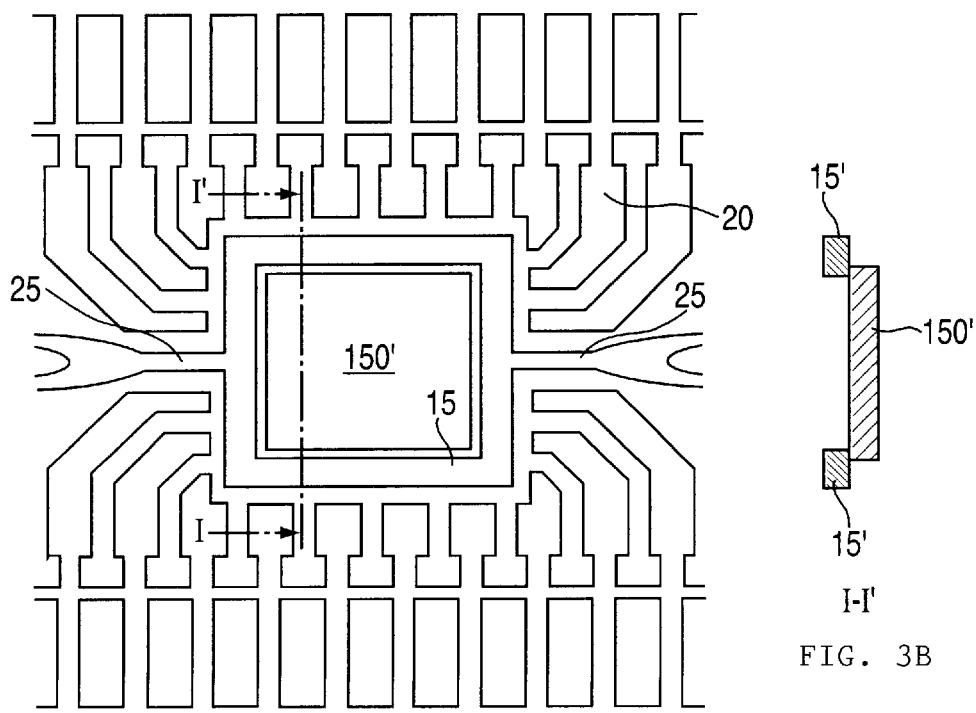
FIG. 3A
FIG. 3B

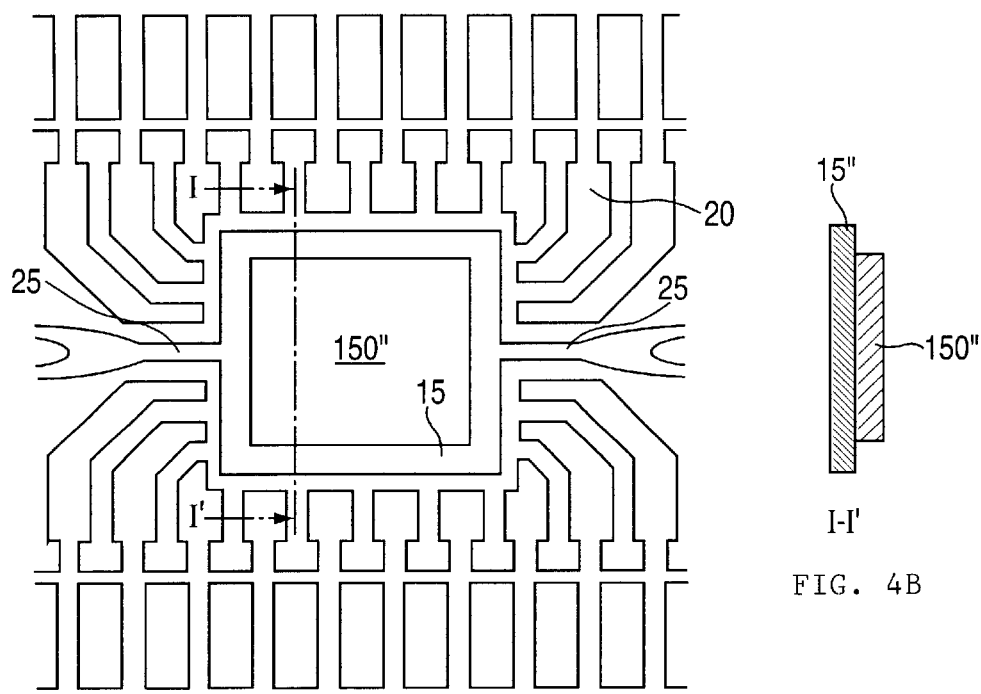
FIG. 4A
FIG. 4B
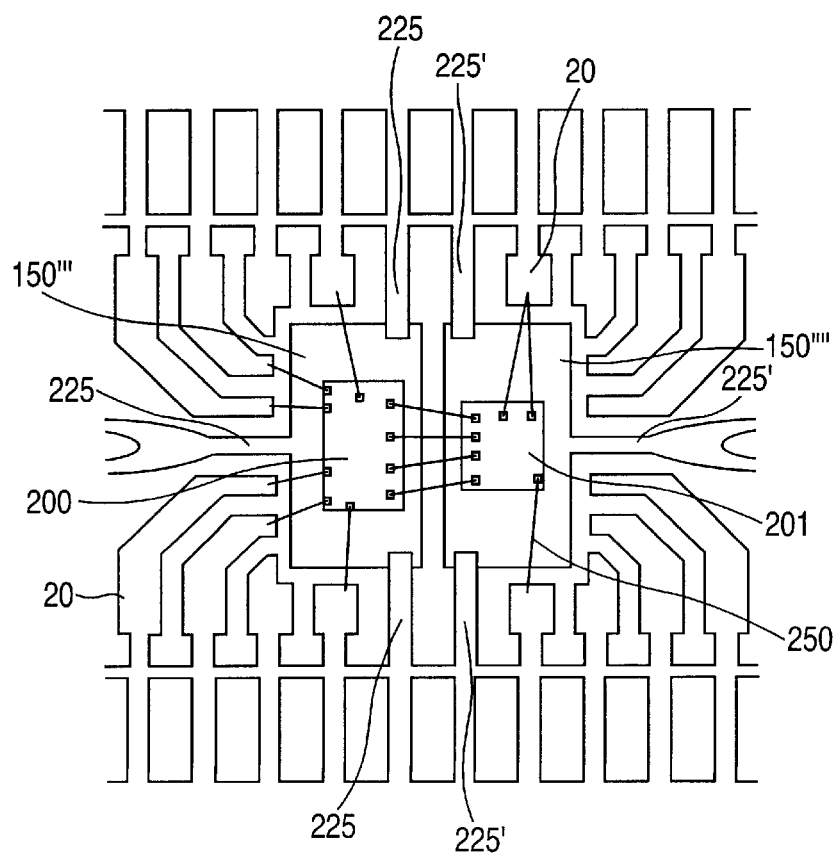
FIG. 5

LEAD FRAME DEVICE AND METHOD FOR PRODUCING THE SAME

BACKGROUND INFORMATION

The present invention relates to a lead frame device, in particular a lead frame device for a voltage-sensitive micromechanical component, as well as a corresponding manufacturing process.

Although applicable to any microelectronic and micromechanical components, the present invention and the general problem underlying it are described with reference to a micromechanical pressure sensor semiconductor chip in silicon technology.

In general, it is necessary to pack microelectronic or micromechanical components (ICs, chips, sensors, etc.), which exists initially in the form of chips or dies, in order to protect them from environmental influences. In this context, the problem of contacting the chips to the external supply lines and to the contiguous hermetic packing must be solved.

A customary process includes the following steps: mounting the chips on a lead frame strip, forming bonds between the external leads or terminals of the lead frame and the bonding pads or bonding spots of the chips, deforming using plastic material, and separating the deformed components.

A customary lead frame strip is depicted in a cutaway view in FIG. 1. In FIG. 1, 10 generally designates the lead frame strip, 15 a die pad or a chip mounting surface, 20 a multiplicity of external leads provided, and 25 tie bars as mounting support for die pad 15.

On a lead frame strip 10 of this type, which is usually made from a stamped or etched copper strip, i.e., of a uniform material, a multiplicity of chips is simultaneously mounted by an automatic device onto die pads 15, e.g., using cementing, soldering, etc., bonded, packed, and finally separated.

The problem underlying the present invention generally lies in the fact that due to the varying thermal coefficients of expansion of the lead frame material, the mounting material (e.g., cement or solder), and the chip material, mechanical stresses can be generated. These stresses can have drastic consequences for the micromechanical pressure sensor semiconductor chip in question, because they can be incorrectly interpreted in routine measurements as external pressure.

In general, the possibility exists to manufacture the lead frame strip, instead of out of copper, out of another, thermally more adapted material, such as FeNi42%. Then the entire lead frame strip would be composed of this material, which would lead to problems in the further automatic assembly. In addition, it can be necessary to simultaneously mount different chips having different thermal requirements. In this case, the above solution could only yield an optimal adaptation for one of these many chips.

SUMMARY OF THE INVENTION

The lead frame device according to the present invention and the corresponding manufacturing process have the advantage that they offer a simultaneous optimal adaptation for a multiplicity of different components having different thermal requirements. The stresses exerted by the different thermal expansion of lead frame and chip or chips are minimized. However, on the other hand, the material properties are maintained that are well suited for the further automatic processing of the lead frame strip, such as good thermal conductivity and good bonding capacity (in particular of the leads). Only the die pad is supplemented or replaced with respect to its material. Thus no substantial alteration of the production line is required.

The idea underlying the present invention lies in the fact that in the die pad area of the lead frame strip, i.e. the mounting area of the die pad, which either has a die pad made of the first material or which has no die pad made of the first material, a die pad is mounted that is adjusted to the chip to be mounted, namely in a supplemental working step, which proceeds analogously to the step of the actual chip assembly but is upstream of it. In this way, materials having varying thermal coefficients of expansion can be integrated in one lead frame strip. In other words, as a result of the present invention, a plurality of different chips made of different materials can be accommodated in one housing on one lead frame.

According to one preferred refinement, the first material is copper or a copper alloy or a copper compound, and the second material is a material that is thermally adapted to the material of the chip, preferably FeNi42% or Kovar. Thermally adapted, in this context, means essentially an adaptation to the thermal coefficients of expansion. However, there can be cases in which thermal conductivity or heat-absorption capacity can also play a role.

According to a further preferred refinement, the die pad made of the second material is mounted on a die pad made of the first material, which is a part of the lead frame. As a result, no modification of the manufacturing process for the lead frame strip is required, but rather only an additional mounting step for the die pad made of the second material.

According to a further preferred refinement, the die pad made of the second material is mounted at its periphery on a die pad frame made of the first material, which is a part of the lead frame. Thus, in the manufacturing process for the lead frame strip, a part of the die pad, originally provided, made of the first material, is stamped out or etched. This configuration is advantageous for the purpose of minimizing positional tolerances.

According to a further preferred refinement, the die pad made of the second material is mounted on tie bars made of the first material, which are parts of the lead frame. Thus, in the manufacturing process for the lead frame strip, the entire die pad, originally provided, made of the first material, is stamped out or etched.

According to a further preferred refinement, the die pad made of the second material is mounted on the lead frame using caulking, cementing, soldering, or welding. These are customary connecting procedures for two metals.

However, in this context, it should be mentioned that the second material can also be a plastic.

According to a further preferred refinement, a further die pad area is provided, within which a further chip is mounted, and a plurality of leads is arranged around the further die pad area; and a die pad made of a third material is mounted for accommodating the further chip in the further die pad area on the lead frame, the third material being either the same as the first or the same as the second or a material that is different from them. In this manner, a multichip module having optimal thermal adaptation can be produced.

BRIEF DESCRIPTION OF THE DRAWINGS

FIG. 2 depicts a schematic representation of a lead frame made of a first material having a die pad mounted thereon made of a second material, as a first specific embodiment of the present invention.

FIGS. 3A and 3B show a schematic representation of a lead frame made of a first material having a die pad mounted thereon made of a second material, as a second specific embodiment of the present invention, in a partial cross-section enlargement along line I–I'.

FIGS. 4A and 4B show a schematic representation of a lead frame made of a first material having a die pad mounted thereon made of a second material, as a third specific embodiment of the present invention, in a partial cross-section enlargement along line I–I'.

FIG. 5 depicts a schematic representation of a lead frame made of a first material having a die pad mounted thereon made of a second material and a die pad mounted thereon made of a third material, as a fourth specific embodiment of the present invention.

DETAILED DESCRIPTION

Figure 1:
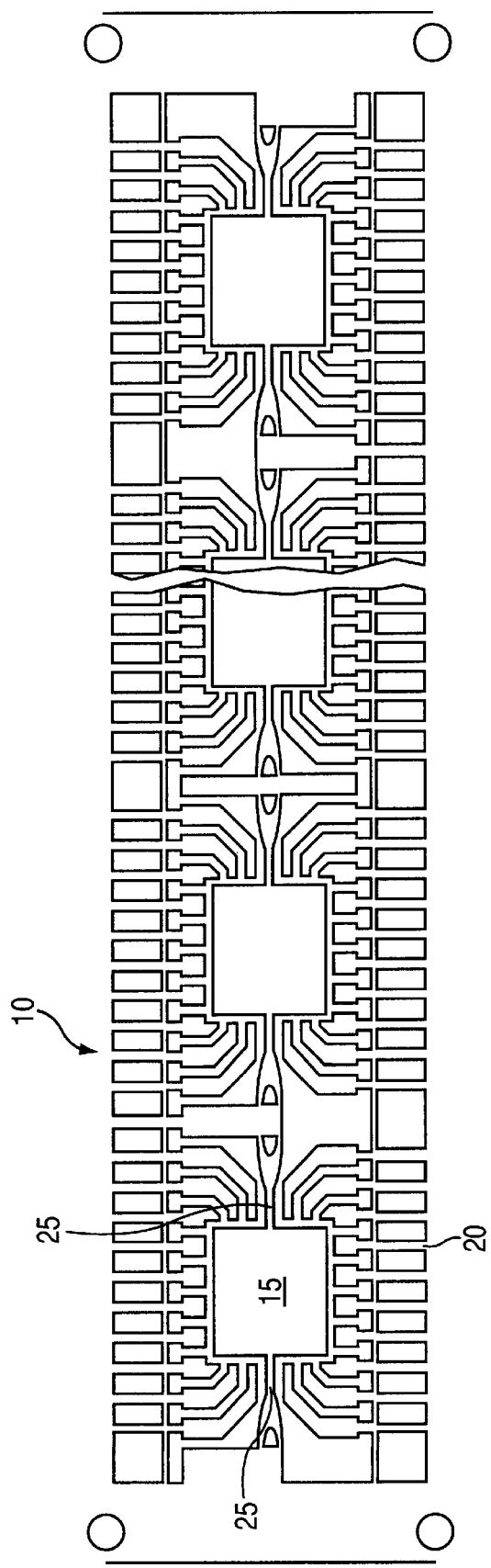
FIG. 1 depicts in cutaway fashion a schematic representation of a customary lead frame strip for purposes of illustration of the general problem of the prior art.

In the Figures, the same reference numerals designate the same or functionally-equivalent elements.

FIG. 2 depicts a schematic representation of a lead frame made of a first material having a die pad mounted thereon made of a second material, as a first specific embodiment of the present invention.

In FIG. 2, 20 designates a lead made of copper, 125 the specific tie bars made of copper, and 150 a die pad made of FeNi42%, which is a material that is thermally adapted to the material of the chip (here silicon). The lead frame made of copper has a central die pad area, within which a chip is mounted. Of the multiplicity of leads that are arranged around the die pad area, only lead 20 is labeled, for reasons of clarity. Die pad 150 made of FeNi42%, in this example, is mounted using caulking on tie bars 125 made of copper, which are a part of the lead frame.

FIGS. 3A and 3B show a schematic representation of a lead frame made of a first material having a die pad mounted thereon made of a second material, as a second specific embodiment of the present invention, in a partial cross-section enlargement along line I–I'.

In FIGS. 3A and 3B, 150' designates the die pad made of FeNi42%, 15' a die pad frame made of copper, which is a part of the lead frame. In this example, die pad 150' at its periphery is mounted on die pad frame 15' using soldering.

FIG. 4 is a schematic representation of a lead frame made of a first material having a die pad mounted thereon made of a second material, as a third specific embodiment of the present invention, in a partial cross-section enlargement along line A–A'.

In FIGS. 4A and 4B, 150" designates the die pad made of FeNi42%, 15" a die pad made of copper, which is a part of the lead frame. In this example, die pad 150" is mounted at its periphery on die pad 15' using areal soldering.

FIG. 5 is a schematic representation of a lead frame made of a first material having a die pad mounted thereon made of a second material and a die pad mounted thereon made of a third material, as a fourth specific embodiment of the present invention.

In FIG. 5, 150''' designates a first die pad made of a highly heat-conductive material A, e.g., silver, and 150'''' a second die pad made of a thermally adapted material B, e.g., FeNi42%. Both die pads 150''' and 150'''' are mounted using welding on tie bars 225 and 225', respectively. Tie bars 225, 225' are made of copper and constitute a part of the lead frame. On die pad 150''' a processor chip 200 is mounted, and on die pad 150'''' a sensor chip 201 is mounted. 250 designates one of a multiplicity of bonding wires provided.

Die pad 150''' made of copper assures good heat dissipation from processor chip 200, and die pad 150'''' assures that the mechanical stresses for sensitive sensor chip 201 are minimized.

In what follows, the process according to the present invention for manufacturing the lead frame devices depicted is discussed in greater detail.

A lead frame strip of copper manufactured from a first material is made available having a plurality of die pad areas, within which a specific chip is to be mounted and to each of which a corresponding plurality of leads is assigned.

Before the chips are mounted, the die pads made of other materials are mounted in predetermined die pad areas, which function so to speak as buffers for thermally induced mechanical stresses.

Then, the mounting, contacting, and packing of the chips takes place in the customary manner, without the necessity of modifying the existing production facilities. In this way, a micromechanical or microelectronic component is produced which is very well adapted thermally.

Although the present invention has been described above on the basis of a preferred exemplary embodiment, it is not limited thereto but rather can be modified in many ways.

In particular, the selection of materials is not limited to the materials indicated, but rather can be determined as desired in accordance with the specific requirements.

For example, Kovar is a further particularly suitable material for the thermally adapted die pad.

Reference Numeral List 10 lead frame strip
15, 15" die pad made of lead frame material
25,125,225,225' tie bars made of lead frame material
20 lead
150, 150',150",150''',150'''' die pads made of thermally adjusted material
15 ' die pad frame made of lead frame material
200 processor chip
201 sensor chip
250 bonding wire

What is claimed is:

1. A lead frame device, comprising:
    a lead frame formed of a first material;
    at least a first die pad area within which a micromechanical chip is mounted and including a first plurality of leads arranged around the at least first die pad area;
    at least a second die pad area within which an evaluation chip is mounted and including a second plurality of leads arranged around the at least second die pad area;
    a first die pad provided with respect to the micromechanical chip and formed of a second material having a thermally adapted coefficient of expansion to the micromechanical chip, the micromechanical chip being mounted in the at least first die pad area on the lead frame; and
    a second die pad for accommodating the evaluation chip and being mounted in the at least second die pad area on the lead frame, the second die pad being formed of a third material that is one of the same as the first material, same as the second material, and different than the first material and the second material; wherein the first material includes one of copper, a copper alloy, and a copper compound, and wherein the second material is thermally adapted to a material of the micromechanical chip, the second material including one of FeNi42% and Kovar.

2. The lead frame device according to claim 1, further comprising:
   a third die pad formed of the first material and being part of the lead frame, wherein:
      the first die pad is mounted on the third die pad.

3. The lead frame device according to claim 1, further comprising:
   a die pad frame formed of the first material and being part of the lead frame, wherein:
      the first die pad is mounted at a periphery thereof on the die pad frame.

4. The lead frame device according to claim 1, further comprising:
   tie bars formed of the first material and being part of the lead frame, wherein:
      the first die pad is mounted on the tie bars.

5. The lead frame device according to claim 1, wherein:
   the first die pad is mounted on the lead frame according to one of a caulking operation, a cementing operation, a soldering operation, and a welding operation.

6. The lead frame device according to claim 1, wherein:
   the micromechanical chip is designed as a micromechanical pressure sensor.

* * * * *

UNITED STATES PATENT AND TRADEMARK OFFICE
CERTIFICATE OF CORRECTION

PATENT NO. : 6,528,868 B1
DATED : March 4, 2003
INVENTOR(S) : Kurt Weiblen et al.

It is certified that error appears in the above-identified patent and that said Letters Patent is hereby corrected as shown below:

<u>Title page, Item [54] and Column 1, line 1,</u>
Change the Title from "LEAD FRAME DEVICE AND METHOD FOR PRODUCING THE SAME" to -- A LEAD FRAME DEVICE WITH MINIMIZED COEFFICIENT OF THERMAL EXPANSION BETWEEN A LEAD FRAME AND CHIPS --

<u>Column 3,</u>
Line 8, change "FIG. 4 is a" to -- FIGS. 4A and 4B show a --
Line 52, change "A-A'" to -- I-I' --

Signed and Sealed this

Fourth Day of May, 2004

JON W. DUDAS
*Acting Director of the United States Patent and Trademark Office*